United States Patent
Spivey

(10) Patent No.: US 7,903,412 B2
(45) Date of Patent: Mar. 8, 2011

(54) MOUNTING SOCKET THAT DISSIPATES HEAT FROM A NETWORK DEVICE

(75) Inventor: Thomas P. Spivey, Pleasanton, CA (US)

(73) Assignee: Cisco Technology, Inc., San Jose, CA (US)

( * ) Notice: Subject to any disclaimer, the term of this patent is extended or adjusted under 35 U.S.C. 154(b) by 32 days.

(21) Appl. No.: 12/353,789

(22) Filed: Jan. 14, 2009

(65) Prior Publication Data

US 2010/0177482 A1 Jul. 15, 2010

(51) Int. Cl.
*H05K 7/20* (2006.01)
(52) U.S. Cl. ............... 361/704; 361/679.54; 361/688; 361/707; 361/715; 165/80.2; 165/185; 174/520; 174/547
(58) Field of Classification Search .......... 361/688, 361/690, 704, 707, 714–715; 165/185, 80.2; 174/50, 547–548, 520; 206/308.1, 477, 493; 220/3.2, 3.8, 3.3, 3.5
See application file for complete search history.

(56) References Cited

U.S. PATENT DOCUMENTS

| | | | |
|---|---|---|---|
| D78,966 S | 7/1929 | Conner | |
| 1,789,693 A * | 1/1931 | Savally | 439/256 |
| 2,246,722 A * | 6/1941 | Del Camp | 439/552 |
| 2,704,354 A * | 3/1955 | Boerum | 439/385 |
| 3,208,511 A * | 9/1965 | McAdam | 165/80.3 |
| 4,910,620 A * | 3/1990 | Olbrich | 360/98.08 |
| D311,486 S | 10/1990 | Hickman | |
| 5,222,800 A | 6/1993 | Chan et al. | |
| D381,281 S | 7/1997 | Miller et al. | |
| 6,042,426 A | 3/2000 | Byrne | |
| 6,249,671 B1 | 6/2001 | Tucker et al. | |
| 6,364,510 B1 | 4/2002 | Bernhart et al. | |
| D459,196 S | 6/2002 | Stouffer | |
| D474,221 S | 5/2003 | Cheng | |
| D477,568 S | 7/2003 | Milby | |
| D484,097 S | 12/2003 | Drane et al. | |
| 7,162,258 B2 | 1/2007 | Beach et al. | |
| D539,229 S | 3/2007 | Murphey | |
| 7,322,860 B2 * | 1/2008 | Martich et al. | 439/676 |
| D587,206 S | 2/2009 | Wu et al. | |
| D588,064 S | 3/2009 | Garner et al. | |
| D596,570 S * | 7/2009 | Spivey | D13/133 |
| D610,101 S * | 2/2010 | Spivey | D13/182 |
| 2005/0245254 A1 | 11/2005 | Hall | |
| 2006/0185876 A1* | 8/2006 | Aviv | 174/50 |
| 2006/0185877 A1* | 8/2006 | Soffer | 174/50 |
| 2006/0185878 A1* | 8/2006 | Soffer | 174/50 |
| 2006/0190739 A1* | 8/2006 | Soffer | 713/189 |

(Continued)

FOREIGN PATENT DOCUMENTS

EP 233465 A1 * 8/1987

(Continued)

*Primary Examiner* — Robert J Hoffberg
(74) *Attorney, Agent, or Firm* — Brinks Hofer Gilson & Lione

(57) ABSTRACT

A socket for mounting a network device is provided. The socket includes a top portion and a bottom portion. The top portion and bottom portion are sized to engage with a network communication device that may be inserted into an interior of the socket from a first side of an installation surface. The top portion and bottom portion may be operable to draw heat away from the network device and release the heat on a second side of the installation surface.

19 Claims, 17 Drawing Sheets

U.S. PATENT DOCUMENTS

| | | |
|---|---|---|
| 2006/0211451 A1 | 9/2006 | Pak |
| 2009/0230827 A1* | 9/2009 | MaCall ...................... 312/223.1 |
| 2010/0177470 A1* | 7/2010 | Spivey ...................... 361/679.02 |
| 2010/0177471 A1* | 7/2010 | Spivey ...................... 361/679.02 |
| 2010/0178795 A1* | 7/2010 | Spivey .......................... 439/527 |

FOREIGN PATENT DOCUMENTS

JP    3140581 U  *  4/2008

\* cited by examiner

MOUNTING SOCKET THAT DISSIPATES HEAT FROM A NETWORK DEVICE

FIELD

The present embodiments relate to a mounting socket that dissipates heat from a network device. In particular, the mounting socket may transfer heat from the network device away from an installation surface.

BACKGROUND

Network devices, such as wireless access points, may be placed on tables or attached to an installation surface, such as a ceiling or wall. Attaching a wireless access point to the installation surface may include using straps or brackets to attach the wireless access point. The straps or brackets are attached to a housing of the network device as well as to the installation surface. The network device is disposed against the installation surface. During operation, the temperature of the network device will increase. Without proper ventilation, the heat from the network device may cause the network device to fail. As a result, the network device is disposed at a safe distance from the installation surface to provide proper ventilation.

DETAILED DESCRIPTION

The present embodiments relate to a mounting socket that dissipates heat from a network device. A mounting system may include a socket and a socket cover. The socket may be installed with an opening of an installation surface, such as a ceiling, wall, or floor. As used herein, the phrase "installed with an opening of an installation surface" may include installed in, on, or around the opening of the installation surface. The socket and installation surface may define a continuous installation cavity. The network device is sized to fit into the installation cavity and engage with the socket. The network device may be inserted into the installation cavity from a first side of the installation surface. The socket may dissipate heat from the network device to a second side of the installation surface. The first side being opposite the second side. In other words, the socket may dissipate heat through the installation surface. The socket cover may engage with the socket. The socket cover may cover the network device. As used herein, the phrase "engage with" includes brought together and interlocked. Interlocked may include connected so that the motion or operation of a part is constrained by another part and may also include connected to allow motion.

In one aspect, a network system includes a socket with a top portion and bottom portion. The socket is made of heat conducting material. A network device is adapted to receive circuitry and be inserted into an interior of the socket. When the network device is inserted into the socket, the socket dissipates heat generated by the circuitry.

In a second aspect, a method for dissipating heat in a network system is provided. The method includes providing a socket with a top portion and bottom portion, wherein the socket is made of heat conducting material; and inserting a network device adapted to receive circuitry into an interior of the socket, wherein when the network device is inserted into the socket, the socket dissipates heat generated by the circuitry.

In a third aspect, a socket for mounting a network device is provided. The socket includes a top portion and a bottom portion. The top portion and bottom portion are sized to engage with a network communication device that may be inserted into an interior of the socket from a first side of an installation surface. The top portion and bottom portion may be operable to draw heat away from the network device and release the heat on a second side of the installation surface.

Figure 1:
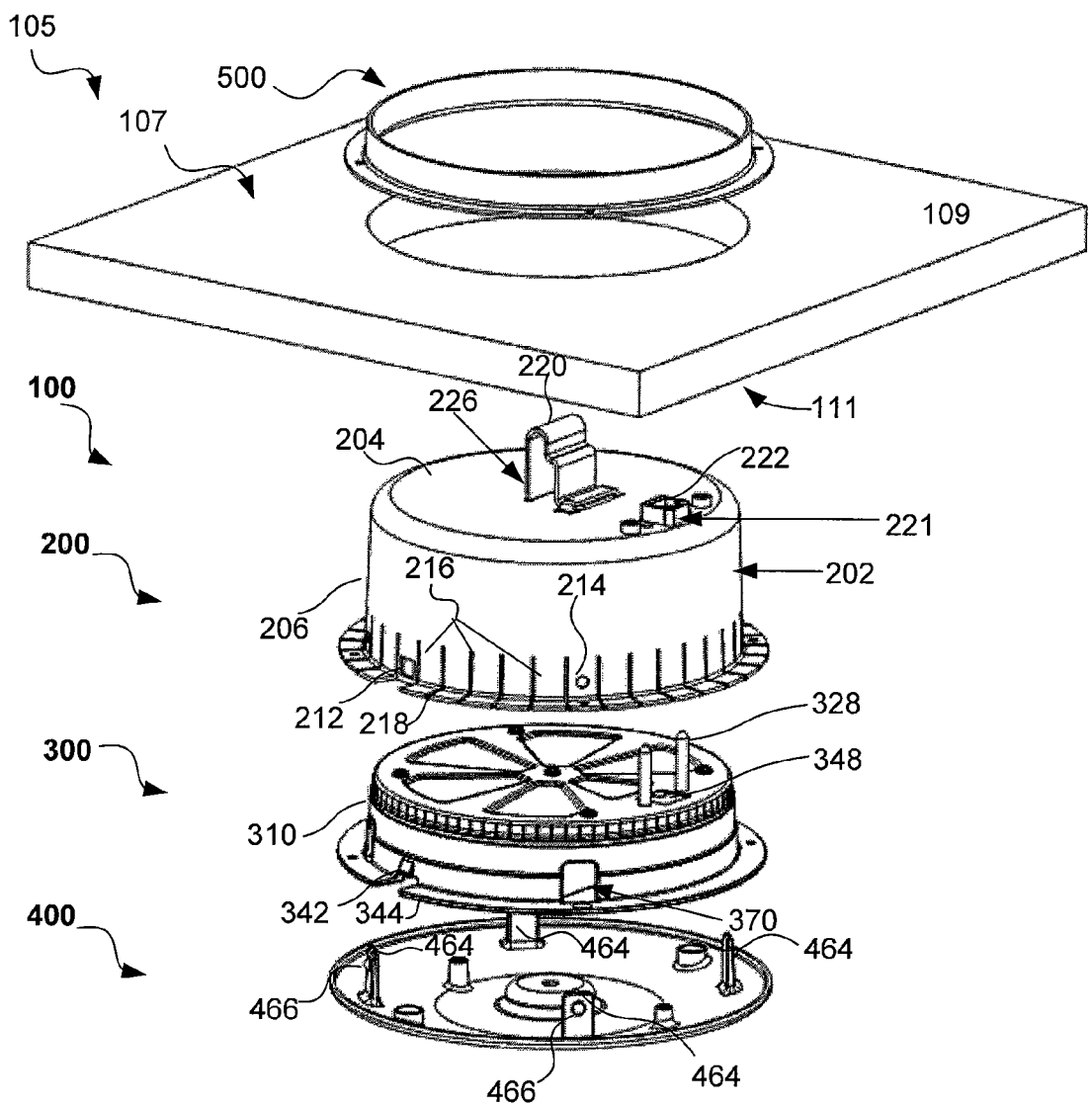
FIG. 1 is an exploded view of one embodiment of a system for mounting a network device.

FIG. 1 illustrates one embodiment of a system 100 for mounting a network device. The system 100 includes a socket 200, a network device 300, and a cover 400. The socket 200 may be coupled with the network device 300 and/or the cover 400. The socket 200 may be installed with an opening 107 of the installation surface 105. The installation surface 105 and/or the socket 200 may define an installation cavity. Herein, the phrases "coupled with," "coupling . . . with," or "couple . . . with" include directly connected to or indirectly connected through one or more intermediate components.

In one illustration of the system 100, which will be referred to herein as the illustration above, a building, such as a residential home or commercial office, includes an installation surface 105 having one or more openings 107. The installation surface 105 may be made up of one or more ceiling tiles. The openings 107 may be integrated into the installation surface 105 when the installation surface 105 is manufactured or built into (e.g., cut out of) the installation surface 105 after the installation surface 105 is manufactured. The socket 200 may be installed in the opening 107. The network device 300, which may be a wireless access point, may engage with the socket 200. For example, the network device 300 may be snapped into the socket 200. The socket cover 400 may engage with the socket 200. The socket cover 400 may cover the network device 300. As a result, the network device 300 is not visible.

In alternative embodiments, the system 100 may include additional, different, or fewer components. For example, as shown in FIG. 1, the system 100 may include a clamp ring 500. The clamp ring 500 may be used to install the socket 200 with the installation surface 105. In another example, the system 100 may include all, some, or none of the components of the network device 300. In yet another example, the system 100 includes only the socket 200 or only the network device 300.

The system 100 may be used for installing the network device 300 in an installation surface 105, such as a ceiling, ceiling tile, rafter, wall, floor, or other support structure. FIG. 1 shows one embodiment of an installation surface 105 and an opening 107. In alternative embodiments, the installation surface 105 may include a plurality of openings 107. The installation surface 105 may be flat, smooth, rough, curved, irregular, or have other surface features. The opening 107 may be a hole, via, recession, lull, bend, dip, or other area intended for installation. The opening 107 may be sized to allow all, some, or none of the socket 200 to fit into, on, or around the opening 107. For example, the opening 107 may be large enough to allow a socket body 202 to pass through the opening 107, but small enough to prevent a flange 218 from passing through the opening 107.

Figure 3:
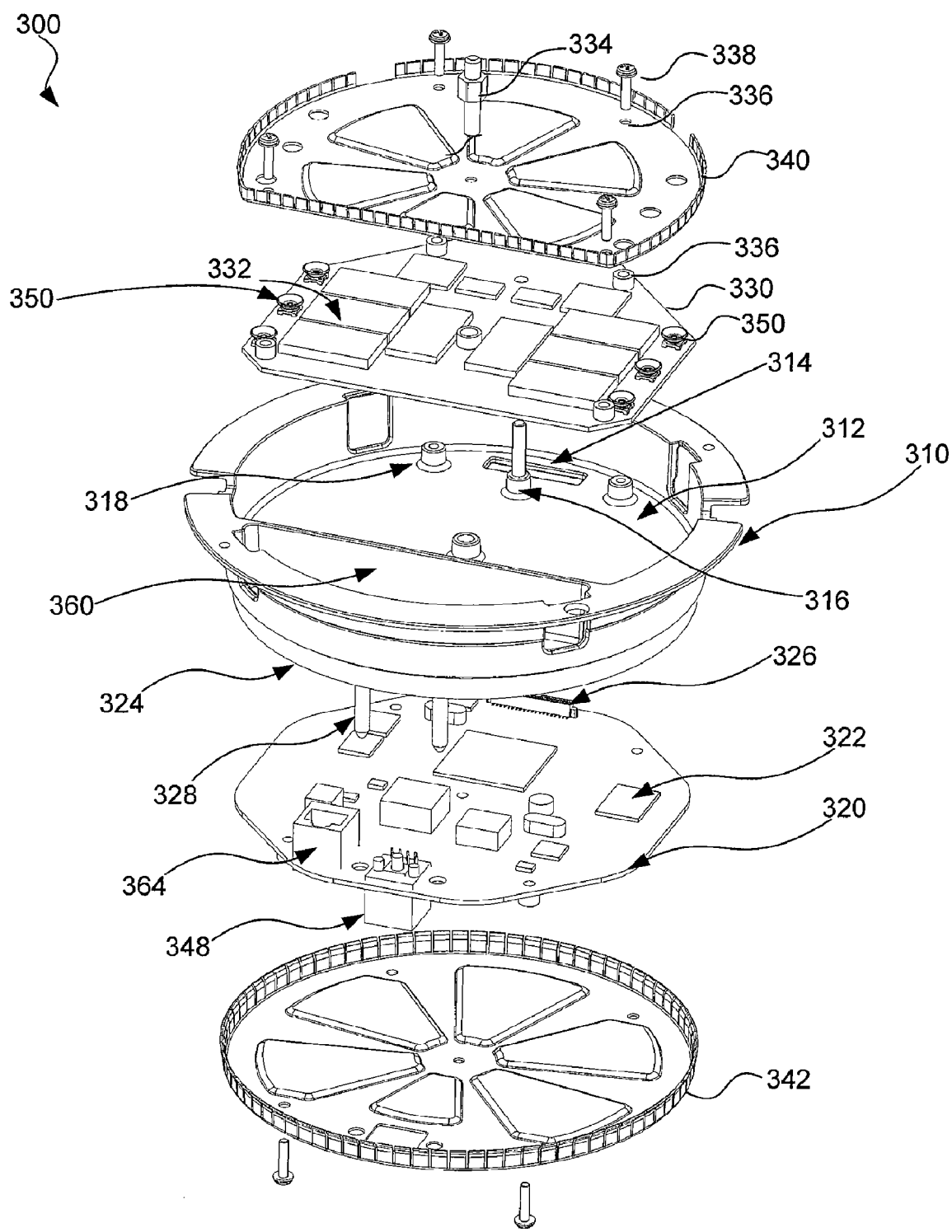
FIG. 3 is an exploded view of one embodiment of a network device.

FIG. 1 shows one embodiment of a socket 200. The socket 200 may include a socket body 202 and a flange 218. The socket body 202 may include one or more side portions 206 and a top portion 204. The socket body 202 may also include one or more fingers 216, one or more finger locks 212, a support clip opening 226, and a connector opening 221. When viewed from a top portion 204, the cross section of the socket 200 may be circular, rectangular, or a different shape used for a socket. The socket 200 may be composed of material capable of transferring heat from a heat source. For example, the socket 200 may be made of aluminum, copper, steel or any other metal. Non-metal materials may be used. In one embodiment, the thickness of the socket may be 0.001 inches to 1 inch, and preferably about 0.062 inches. However, other thicknesses may be utilized as well. The interior of the socket 200 may be generally open as shown in FIG. 3 and may be sized to receive the network device 300. For example, in some embodiments, the diameter of the interior may be about 4-8 inches; and preferably, 6 inches. However, the diameter may be made larger or smaller and shaped so as to provide a snug fit with the network device 300. The side portions 206 of the socket 200 may be slightly tapered so that the diameter at the bottom of the socket 200 is larger than the diameter at the top of the socket 200. Other embodiments do not have taper. Stops may be provided.

The socket 200 may include one or more fingers 216 around a side portion 206 (i.e., bottom portion), as shown in FIG. 1. Each finger 216 may include a flange 218 extending away from the interior of the socket 200. In some embodiments, the socket 200 may be utilized as a heat sink for the network device 300 with the fingers 216 and flanges 218 drawing heat away from the network device 300. The spring force of the fingers 216 may be utilized to tightly press the fingers 216 up against an outer peripheral portion of the network device 300, thus providing good contact for drawing away heat, as shown in FIG. 3. The spring force may also press the flanges 218 up against complementary flanges 344 on the network device 300. Heat generated by the network device 300 may be transferred to the socket 200 via the flanges 218 and fingers 216 and then dissipated by the socket 200. In one embodiment, the socket 200 is installed in a surface such as a ceiling tile, as shown in FIG. 1. A portion of the socket 200 may be disposed within a cavity above the ceiling tile where heat may be dissipated. At least one advantage to this configuration is that it moves heat that would otherwise build up on the ceiling tile into the cavity where it may be dissipated more quickly. This in turns enables better heat dissipation for the network device.

In one embodiment, the socket may include a top portion 204 and a bottom portion, such as the side portion 206. The top portion and bottom portion may be sized to engage with the network device 300. The network device 300 may be inserted into an interior of the socket 200 from a first side 111 of the installation surface 105. The top portion 204 and bottom portion may be operable to draw heat away from the network device 300 and release (or transfer) the heat on the second side 109 of the installation surface 105. At least one finger 216 of the socket 200 may engage with the network device 300 and transfer the heat to the top portion 204 disposed on the second side 109 of the installation surface 105. Alternatively, or additionally, the network device 300 may include a network device flange 344 that engages with a socket flange 218. The socket flange 218 may be operable to transfer heat from the network device flange 344 to the top portion 204 that is disposed on a side of the installation surface that is opposite the network device flange.

Referring back to FIG. 1, one or more recesses 214 for engaging one or more locking tabs 464 on a socket cover 400 may be defined in one or more of the fingers 216. The recess 214 may or may not extend through the socket 200. The recess 214 may be circular, square, rectangular or a different shape.

The socket 200 may also include one or more finger locks 212. The one or more finger locks 212 may include one or more lock recesses for engaging a locking tab 464 on the network device 300. The finger locks 212 may be disposed on one or more of the fingers 216. The finger locks 212 may or may not extend through the socket 200 and may be circular, square, rectangular or a different shape.

Figure 19:
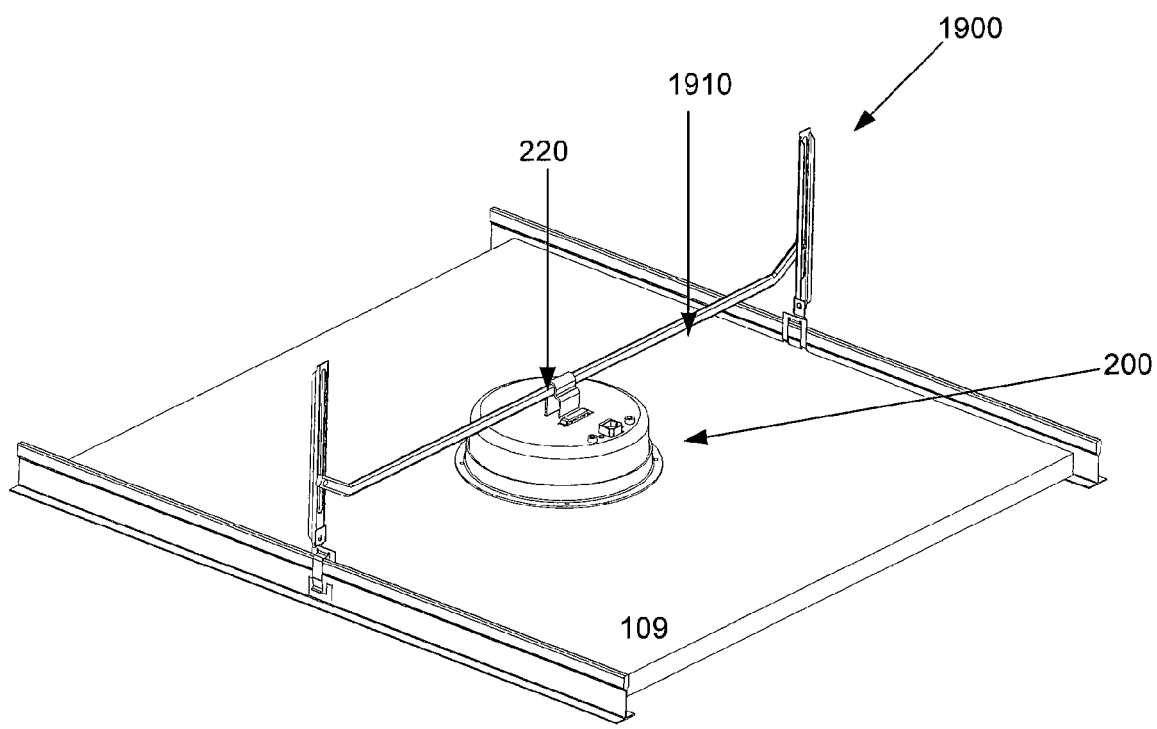
FIG. 19 illustrates one embodiment of a support structure for a socket.

A support clip opening 226 may be defined in the top portion 204 of the socket 200 for securing a support clip 220 to the socket 200. The support clip 220 may enable securing the socket 200 to a surface or structure. For example, the support clip 220 may enable hanging the socket 200 in the cavity above a ceiling tile. The support clip 220 may be attached to a support structure 1900. As shown in FIG. 19, the support structure 1900 may be a caddy hanger that is installed to provide additional support for the socket 200. The caddy hanger may include a support rod 1910 that attaches to the support clip 220. The support structure 1900 may be attached to a support structure, other than the installation surface 105, to reduce the pressure placed directly on the installation surface 105. One benefit of attaching the support clip 220 to the support structure 1900 is that the installation surface 105 does not need to bear the entire weight of the network device 300. The weight of the network device 300 may be distributed to other surfaces or structures, such as the rods used to install ceiling tiles. In alternative embodiments, the support structure 1900 may be other now known or later developed supporting devices.

Figure 7:
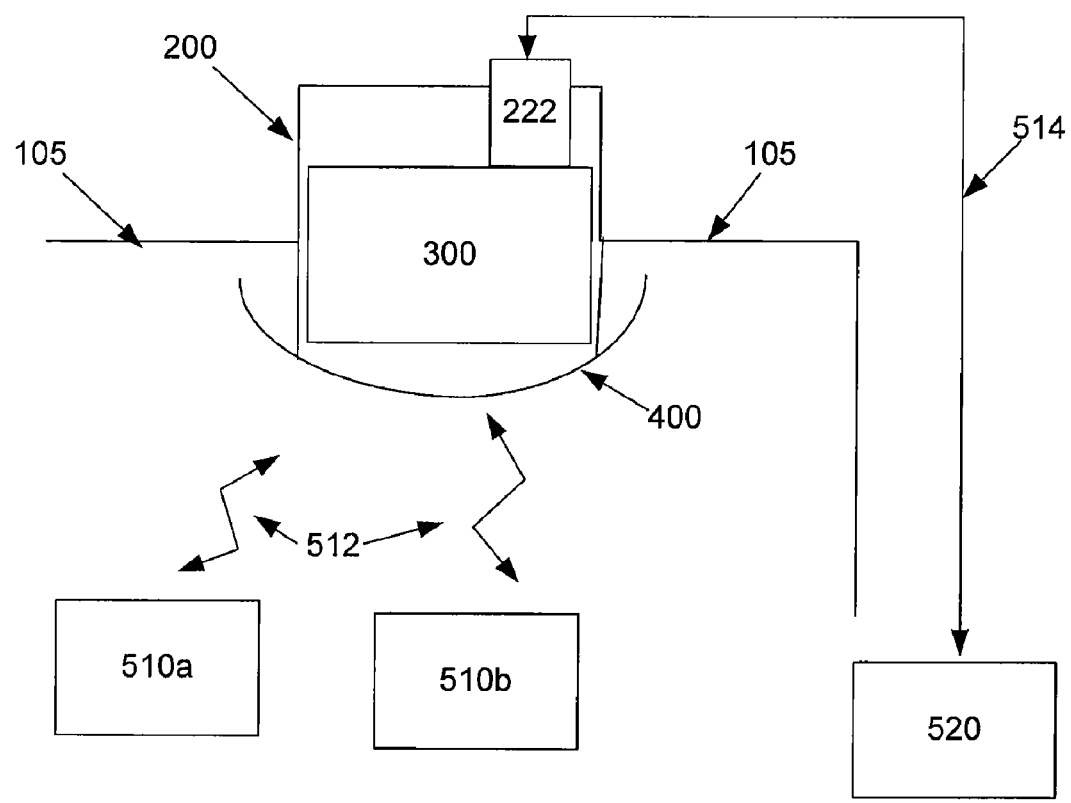
FIG. 7 shows one embodiment of a network device during operation.

A connector opening 221 for inserting a socket connector 222 may be defined in the top portion 204 of the socket 200. For example, a network connector 222 may be inserted into the opening 221. The network connector 222 may be an electrical connector that enables interfacing network circuitry within the network device 300 to external network devices, as shown in FIG. 7 and discussed below.

Figure 2:
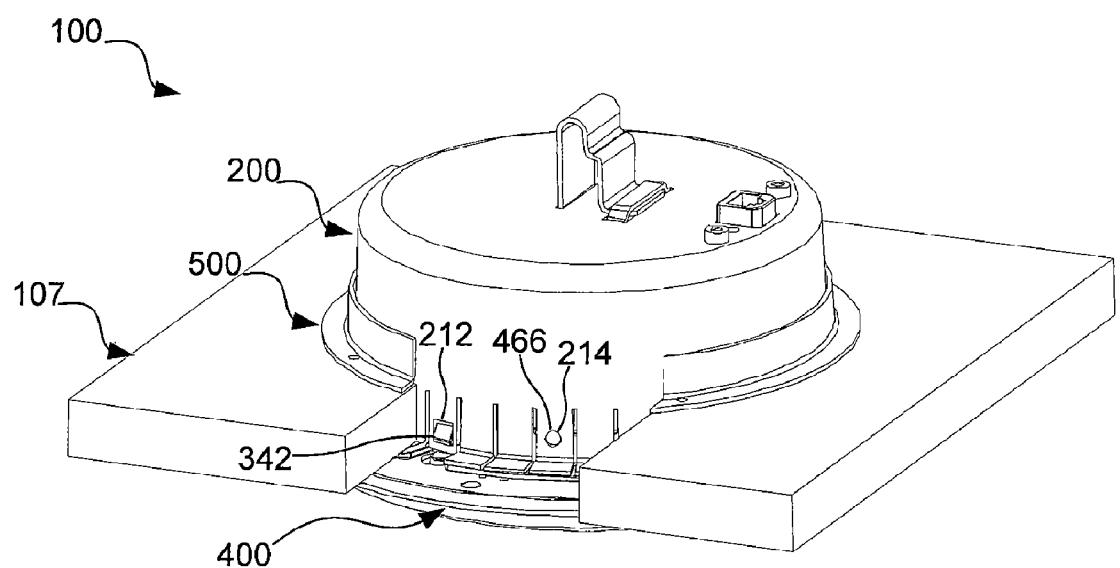
FIG. 2 shows one embodiment of a system for mounting a network device in an assembled configuration.

FIG. 2 shows the system 100 in an assembled configuration. As shown, when assembled, the locking tab 342 of the network device 300 resides within the finger locks 212 of the socket 200. The locking tab 342 enables inserting the network device 300 into the socket 200, and securing the network device 300 to the socket 200 once the network device 300 is inserted into the socket 200. Once secured, the network device 300 may be removed from the socket 200 via a security tool, as described below. At least one advantage of this approach is that it enables quickly securing the network device 300 to the socket. For example, in some embodiments, an operator may secure the network device 300 to the socket by simply pushing the network device into the socket. No fasteners may be needed to secure the network device. Once inserted, the network device may not be removed without the security tool.

One benefit of the locking tab 342 and finger lock 212 combination is that the network device 300 may be engage with (e.g., snap into and out of) pre-installed sockets 200. For example, in the illustration above, sockets 200 may be installed in the building before a tenant or owner moves into the building. Once the tenant or owner takes possession of the building, a desired network device 300 (e.g., including access point functionality) may be chosen and engaged with the socket 200. If the owner or tenant desires to replace the chosen network device 300, the chosen network device 300 may be quickly removed and replaced with a different network device 300 (e.g., including updated access point functionality).

Also when assembled, the locking tab 464 of the socket cover 400 resides within the recess 214 of the socket 200. The locking tab 464 enables removably securing the cover 400 to the socket 200. For example, an operator may secure the cover to the socket by simply pushing the cover 400 up against the socket 200. The operator may remove the socket by simply pulling on the cover.

FIG. 3 shows an exploded view of one embodiment of a network device 300. The network device 300 may include a circuit receptacle 310, a network device circuit assembly 320, and an antenna circuit assembly 330. The circuit receptacle 310 may be coupled with and/or support the network device circuit assembly 320 and/or the antenna circuit assembly 330. In alternative embodiments, the network device 300 may include additional, different, or fewer components. For example, the antenna circuit assembly 320 and the network device circuit assembly 330 may be integrated into a single circuit board or integrated with the circuit receptacle 310. In another example, the system 100 may not include an antenna; and thus, the antenna circuit assembly 330 may not be provided.

The network device 300 may be a wireless access point, a switch, a hub, a lighting device, an audio speaker device, a sensor device, or other now known or later developed device used within a wireless or wired network. The network device 300 may be used to provide network features, such as routing, monitoring, lighting, relaying, communicating, or other now known or later developed network features.

The circuit receptacle 310 may be a frame, housing, enclosure, support structure, or other module interface. The circuit receptacle 310 may be composed of material capable of transferring heat from a heat source. For example, the circuit receptacle 310 may be made of aluminum, copper, steel or any other metal. Other materials may be used, including non-heat conductive materials.

The circuit receptacle 310 may be sized and shaped to engage the socket 200, such that the network device 300 is disposed in the opening 107 of the installation surface 105. As discussed below, the circuit receptacle 310 may engage with the socket 200. All, some, or none of the network device 300 may be disposed above, below, or in the opening 107 of the installation surface 105. The circuit receptacle 310 may be press fit or snug fit into the socket 200, threaded into the socket 200, snapped into the socket 200, or otherwise connected with the socket 200.

The circuit receptacle 310 may be adapted to receive the network device circuit assembly 320 and/or the antenna circuit assembly 330. Herein, the phrase "adapted to receive" may include sized and/or shaped to support and/or secure. For example, as shown in FIG. 3, the circuit receptacle 310 includes an antenna module 312 that includes one or more walls or dividers that are positioned to receive the antenna circuit assembly 330. The antenna module 312 may include an opening 314 that allows a circuit connector 326 to extend into or out of the antenna module 312 and electrically and/or mechanically connect electrical and/or mechanical components of the network device circuit assembly 320 and the antenna circuit assembly 330. The antenna module 312, which may be circuit receptacle cavity, may include one or more alignment pins 316 that guide the antenna circuit assembly 330 into the antenna module 312 and fasteners 318 (e.g., nuts or clips) that may be used to secure the antenna circuit assembly 330 to the circuit receptacle 310. An antenna circuit cover 340 may be disposed over the antenna circuit assembly 330, so as to protect the antenna circuit assembly 330 from electrical and physical interference. The antenna circuit cover 340 and antenna circuit assembly 330 may include one or more openings 336 that are sized to receive one or more securing devices 338 (e.g., bolts or screws). The one or more securing devices 338 may be inserted through the openings 336 and connected to the fasteners 318. Accordingly, the antenna circuit assembly 330 and antenna circuit cover 340 may be secured in the antenna module 312. In one embodiment, the antenna circuit cover 340 includes an opening that allows a securing connector 334 to extend from or through the opening and mechanically couple the cover 400 to the network device 300. The securing connector 334 may be a threaded pin and nut. The securing connector 334 may align the cover 400 with the network device 300.

The circuit receptacle 310 may also include a network device module 324 that includes one or more walls or dividers positioned to receive the network device circuit assembly 320. As discussed above for the antenna module 312, the network device module 324 may include an opening that allows a circuit connector 326 to extend into or out of the network device module 324 and electrically and/or mechanically connect electrical and/or mechanical components of the network device circuit assembly 320 and the antenna circuit board 330. The opening 314 may be the same opening for the antenna module 312 and the network device module 324, but a separate opening may be used. The network device module 324 may include one or more alignment pins 328 that guide the network device circuit assembly 320 into the antenna module 312 and fasteners (e.g., nuts or clips) that may be used to secure the network device circuit assembly 330 to the circuit receptacle 310. A network device cover 342 may be disposed over the network device circuit assembly 320, so as to protect the network device circuit assembly 320 from electrical and physical interference. The network device circuit cover 342 and network device circuit assembly 320 may include one or more openings that are sized to receive one or more securing devices (e.g., bolts or screws). The one or more securing devices may be inserted through the openings and connected to the fasteners. Accordingly, the network device circuit assembly 320 and network device cover 342 may be secured in the network device module 324. In one embodiment, the network device circuit cover 342 includes an opening that allows a network device connector 348 to extend from or through an opening and electrically couple a wired network to the network device circuitry 322 disposed on the antenna circuit assembly 320. The network device connector 348 may electrically and/or mechanically couple with the socket connector 222, as discussed below.

The network device circuit assembly 320 and the antenna circuit assembly 330 may be or include printed circuit boards with circuitry. Alternatively, or additionally, the network device circuit assembly 320 and the antenna circuit assembly 330 may be removable or integrated with the circuit receptacle 310.

Figure 4:
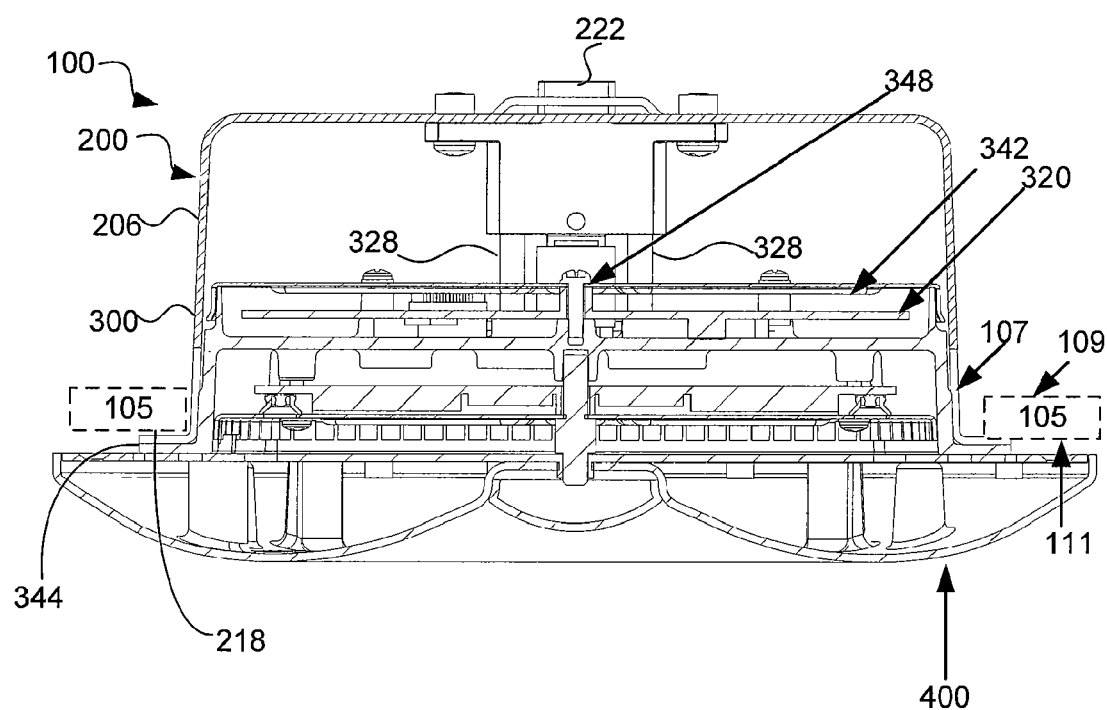
FIG. 4 is a cross sectional view of one embodiment of an assembled system for mounting a network device.
Figure 5:
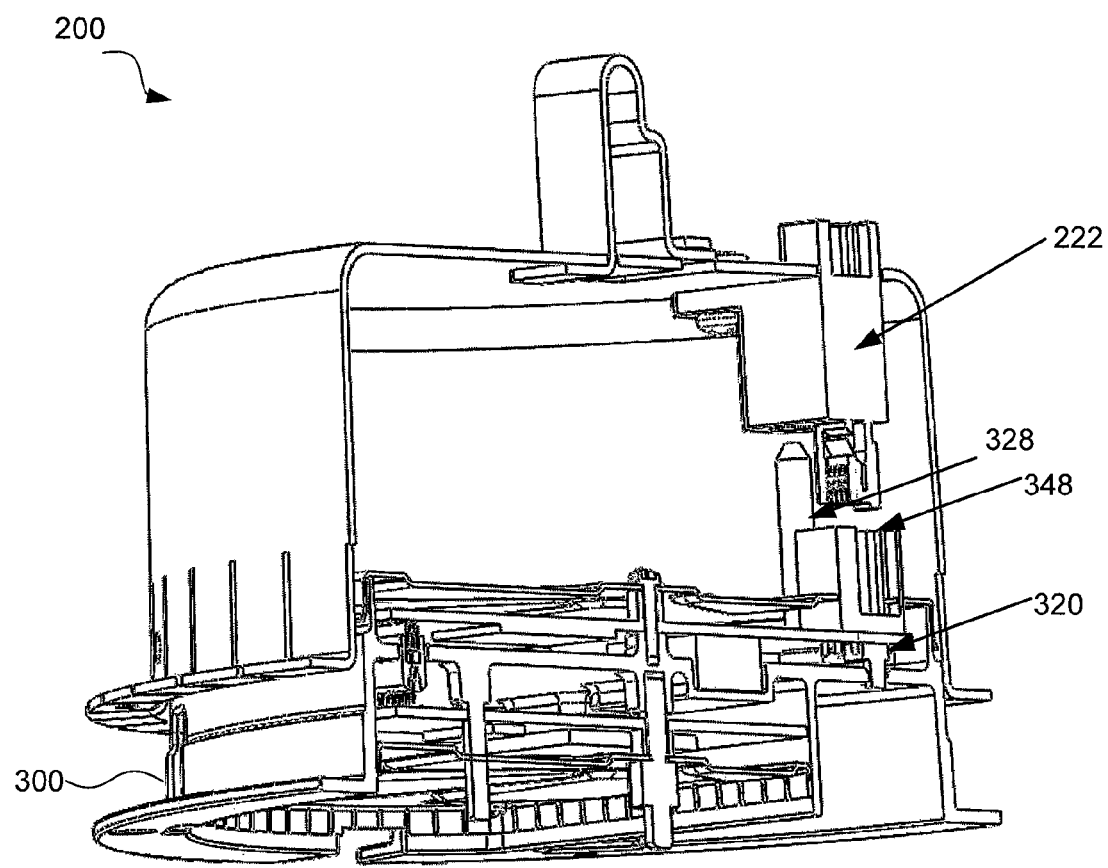
FIG. 5 is a cross sectional view of one embodiment of a network device and a socket.
Figure 6A:
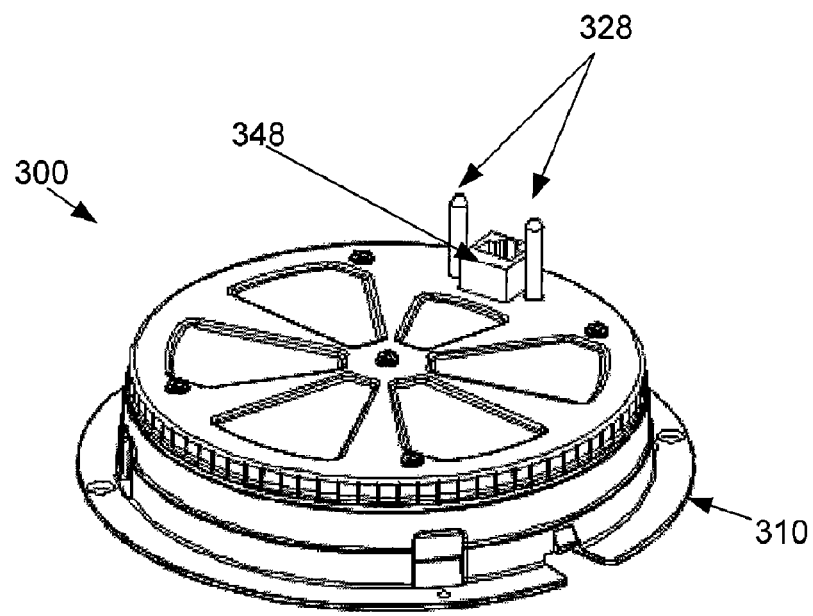
FIG. 6A is a top view of one embodiment of a network device.
Figure 6B:
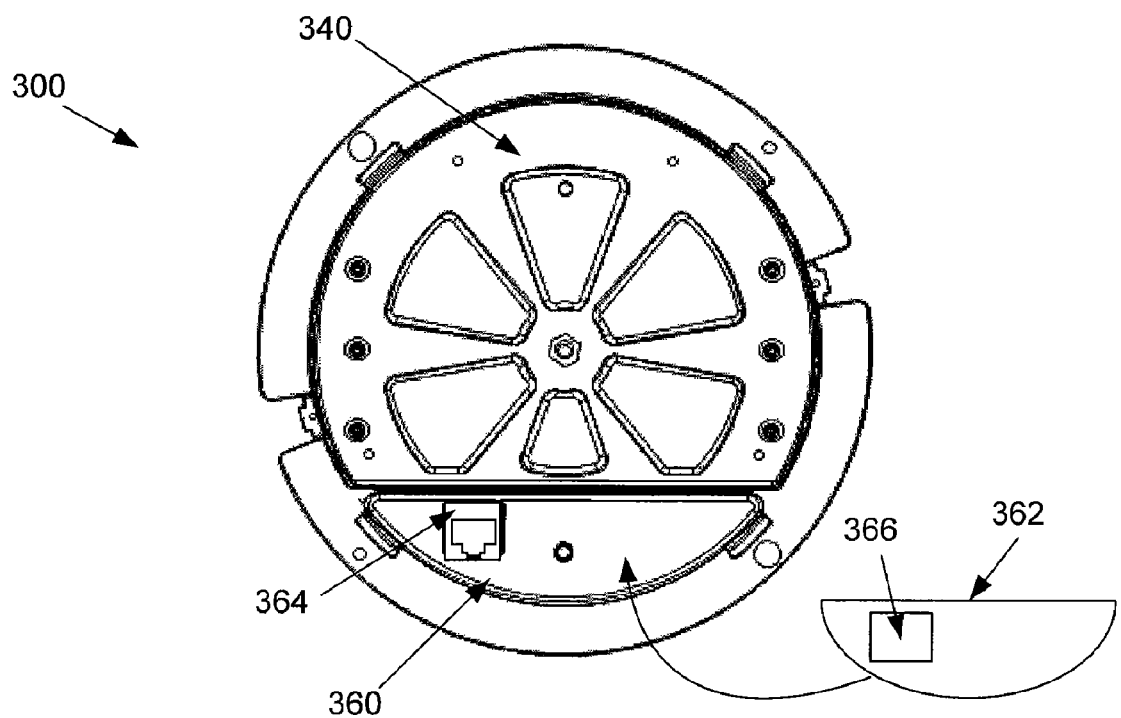
FIG. 6B is a bottom view of one embodiment of a network device.

When assembled, as shown in FIG. 4, the network device 300 may include a network device connector 348 that extends into or through the network device cover 342. Alternatively, the network connector 348 may be accessed through an opening in the network device cover 342. The network device 300 may electrically and/or mechanically couple a socket connector 222 with the network device circuit 322 on the network device circuit assembly 320, as shown in FIG. 5. When the network device 300 is being installed, the alignment pins 328 may guide the network device 300 such that the network connector 348 engages the socket connector 222. The one or more alignment pins 328 may enable aligning a connector 348, such as a network connector, with the socket connector 222 on the socket 200, as shown in FIG. 6A. Although the drawings show a female connector 348 and male socket connector 222, the socket connector 222 may be a female component and the network component 348 may be a male component. In alternative embodiments, the network connector 348 and socket connector 222 may be other now known or later developed connectors. FIG. 6B shows the network device 300 from antenna circuit cover 340 side. As discussed below, the network device 300 may include an additional circuit module 362.

One benefit of the network device connector 348 and socket connector 222 combination is that a blind connection may be provided between a wired network and the network device 300. In other words, wires do not need to be used to connect the network device 300 to the wired network. The connections may be provided out of sight, for example, on the first side of the installation surface 109.

The network device circuit assembly 320 may include a network device circuit 322, which may include a processor and memory. The network device circuit 322 may be disposed on and attached to the network device circuit assembly 320. The network device circuit 322 is operable to perform functions associated with the network device and/or provide one or more network services, such as communicating, sensing, relaying, or lighting. For example, in one embodiment, as shown in FIG. 7, the network device circuit 322 may be operable to perform functions associated with an access point, such as allowing a wireless communication device 510a (e.g., a computer, a personal digital assistant, or a printer) to connect to a wireless network 512 using Wi-Fi, Bluetooth and/or related standards. The network device 300 may relay (communicate) data between the wireless communication device 510a and one or more wireless communication devices 510b using the wireless network 512. Alternatively, or additionally, the network device 300 may connect to a wired network 514 and may transmit data (e.g., signals or messages) between the wireless communication device 510a and one or more wired devices 520 (e.g., computers, servers, or printers) connected to the wired network 514.

In another exemplary embodiment, the network device 300 may include or be coupled with a motion sensor. The network device circuit 322 may receive data from the motion sensor, which may detect motion in a hallway or other area. The sensor data may be processed and transmitted to one or more wired devices 520. In another exemplary embodiment, the network device circuit 322 may receive data from one or more wired devices 520. The network device circuit 322 may be used to perform a function associated with the system 100. For example, the network device circuit 322 may receive a control signal from a control hub that causes a light to be switched on or off. The light may be wired to or wirelessly coupled with the network device circuit 322.

The circuit receptacle 310 may include a flange 344. The flange 344 may be sized to fit under the flange 218 of the socket. The flange 344 may extend around an edge of the receptacle and may be sized to fit under a socket flange. The flange 344 and flange 218 may include openings that may be aligned to receive a securing pin.

In one alternative embodiment, the circuit receptacle 310 may include threading on an outer edge of the circuit receptacle 310. The threading may engage threading disposed on an inner surface of the socket 200. The circuit receptacle 310 may be screwed into and supported by the socket 200.

As shown in FIG. 1, the circuit receptacle 310 may include one or more locking tabs 342 for engaging one or more finger locks 212 of the socket 200. The locking tabs 342 may be tapered on one side so as to enable inserting the network device 300 within the socket 200. On the opposite side, the locking tab 342 may not be tapered or is taped so as to prevent removal of the network device. A security passage for inserting a security tool may be defined in the opposite side, as described below.

One or more alignment pins 328 may enable aligning the network device 300 with the socket 200, so that the socket connector 222 is aligned with a complementary connector on the network device 300, such as the network device connector 348.

When the socket 200 is installed in the installation surface 105, a first portion of the circuit receptacle may be disposed on a first installation side 109 of the installation surface 105 and a second portion of the circuit receptacle 310 may be disposed on a second installation side 111 of the installation surface 105. As shown in FIG. 1, the first installation side 109 is opposite the second installation side 111, but may be located at other relative positions. The first installation side 109 may be disposed on a side opposite the antenna cover 400 and/or the flange 218. The second installation side 111 may be disposed on the same side as the antenna cover 400 and/or the flange 218. Alternatively, or additionally, the second installation side 111 may be disposed facing a hallway, room, or other area normally occupied by humans. The second installation side 111 may be visible during normal operation of the network device 300; whereas, the first installation side 109 may not be visible during normal operation of the network device 300. Accordingly, the first installation side 109 may be referred to as being above the installation surface 105, and the second installation side 111 may be referred to as being below the installation surface 105.

In one exemplary embodiment, as shown in FIG. 3, the circuit receptacle 310 may include a connector 348 coupled with a socket connector 222 that connects to a wired network 514 and a flange 344 that extends around an edge of the circuit receptacle 310. The circuit receptacle 310 may engage with the socket 200 such that the connector 348 is disposed on the first installation side 109 and the flange 344 is disposed on the second installation side 111. In another exemplary embodiment, also shown in FIG. 3, a network device circuit assembly 320 may be disposed on the first installation side 109 and the socket cover 400 is disposed on the second installation side 111.

Figure 8A:
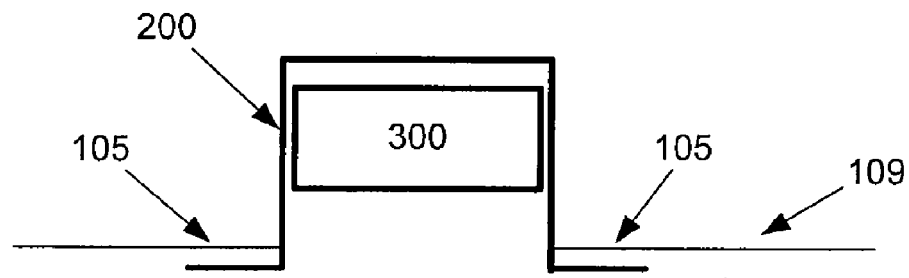
FIG. 8A, FIG. 8B, and FIG. 8C show different embodiments of a mount system.
Figure 8B:
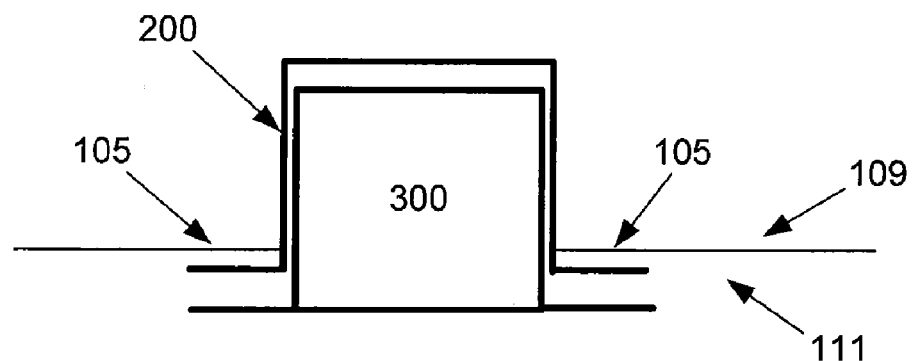
Figure 8C:
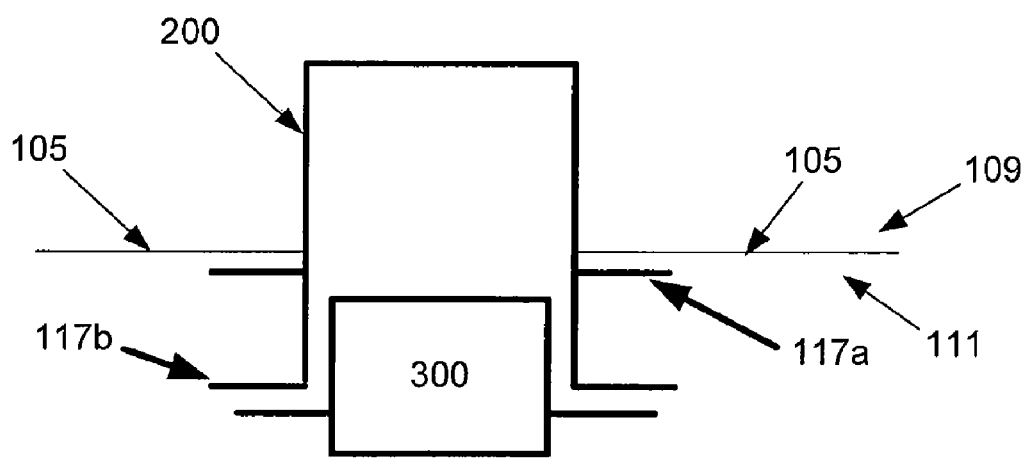

As shown in FIGS. 8A, 8B, and 8C, all, some, or none of the network device 300 may extend into or through the opening 107 in the installation surface 105. In the example of FIG. 8A, all of the network device 300 may be installed on the first installation side 109. In this example, the network device 300 may engage the socket 200 using threading, a snap connector, glue, or other connection device. In the example of FIG. 8B, a first portion of the network device 300 is disposed on a first installation side 109, a second portion of the network device 300 is disposed on a second installation side 111, and a third portion of the network device 300 is disposed in the opening 107 of the installation surface 105. In the example of FIG. 8C, none of the network device 300 is disposed on the first installation side 109. In other words, the entire network device 300 may be disposed on the second installation side 111. In this example, the socket may include an additional flange 117b, such that network device 300 may be coupled to the socket 200 using the additional flange 117b. Alternatively, or additionally, the network device 300 may engage with the socket 200 using threading, a snap connector, glue, or other connection device. The flange 117a may be used to couple the socket 200 to the installation surface 105.

One benefit of using a snap connector or other connector that allows the network device 300 to be removed from the socket 200 is that a socket 200 may be installed with the installation surface 105 at a time before the network device 300 is coupled with the socket 300. The network device 300 may be installed at a later time than the socket 300. Alternatively, or additionally, the snap connector provides for a fast, easy installation of the network device 300.

The circuit receptacle 310 may include one or more antennas connectors 350. The one or more antennas connectors 350 may be used to couple the antenna circuitry 332 with one or more antennas 352, such as patch antennas, dipole antennas, or other types of antennas for transmitting and receiving wireless signals. The one or more antenna may be attached to and/or integrated with the circuit receptacle 310, for example, the antenna circuit board cover 340. The one or more antennas 350 may be electrically coupled with the antenna circuit 322. The antenna circuit 322 may process signals transmitted from or to the network device 300.

Figure 9A:
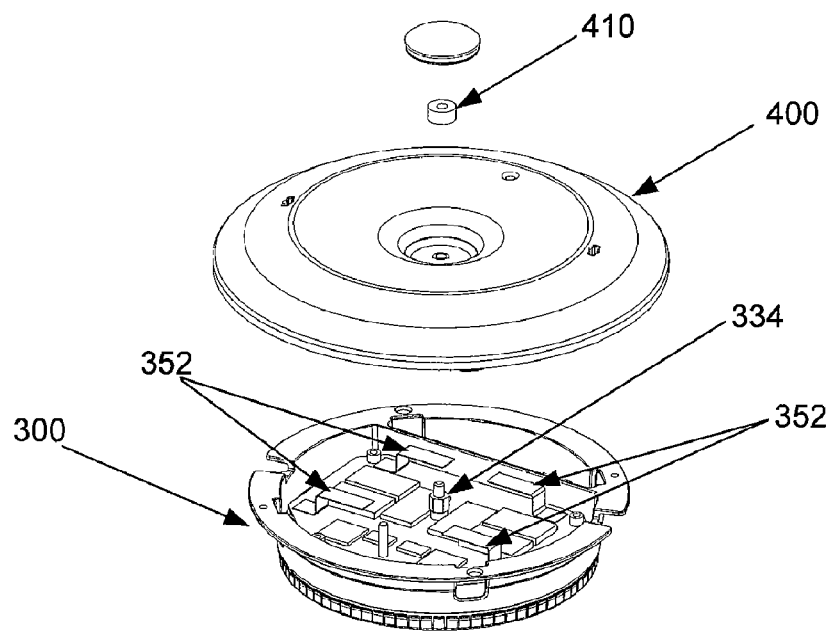
FIGS. 9A and 9B show different embodiments of an antenna assembly.
Figure 9B:
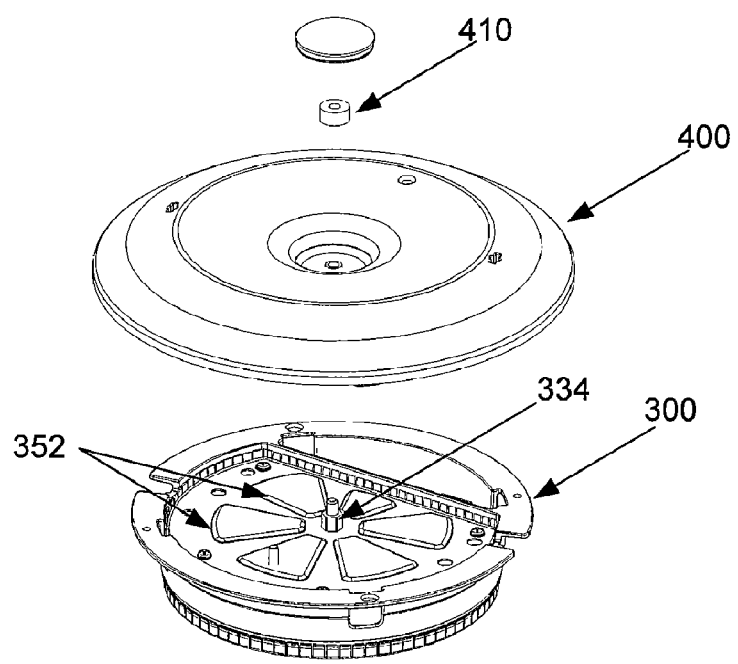

FIGS. 9A and 9B illustrate exemplary embodiments of the one or more antennas 352. FIGS. 9A and 9B illustrate a plurality of printed circuit board antennas that are mechanically attached to the antenna circuit board cover 340 and electrically coupled with the antenna circuit 322. As shown in FIG. 9A, the network device 300 includes a plurality of antennas 352 that are formed as patch antennas operating above or below the antenna circuit board. As shown in FIG. 9B, the network device 300 includes a plurality of antennas 352 that are disposed in the antenna circuit board cover 340.

The circuit receptacle 310 may include an add-on module 360, as shown in FIG. 6B. The add-on module 360 may be a housing, enclosure, module, casing, or other area that is sized to receive an additional network module 362. The additional network module 362 may provide additional network features to the network device 300. The additional network features may include new, add-on, or replacement features. The additional network features may include hardware and software modules. For example, the network device 300, as originally installed may not include a software module that is operable to support a cellular radio. The additional network module 362 may include a software module that supports a cellular radio.

The add-on module 360 may include an opening that allows an add-on connector 364, which may be disposed on the network device circuit assembly 320, to extend into the add-on module 360 and couple with the additional network module 362. In an alternative embodiment, the add-on module 360 may include the add-on connector 364 that extends through an opening in the circuit receptacle 310 and couples with the network device circuit 322. The add-on connector 364 may couple the network device circuit 322 with a circuit of the additional network module 362. For example, the add-on connector 364 may be coupled with a connector 366 of the additional network module 362. The connector 366 may be coupled with an add-on circuitry that may be used to perform add-on functions.

The additional network module 362 may be a device used for performing additional functionality. One benefit of an additional network module 362 that may be connected to the network device circuit 322 is that the additional network module 362, which may include a processor and memory, and the network device circuit 322 may operate in parallel or in conjunction with each other. For example, the network device circuit 322 may be used to provide access point functionality and the additional network module 362 may be used to provide sensing functionality. In the illustration above, the owner or tenant may decide, after installing the access point functionality, that the functionality of the network device 300 may be expanded. In this illustration, an additional network module 362 may be added to the network device 300 that provides the sensing functionality.

The socket cover 400 may be a shield or other now known or later developed cover. The socket cover 400 may mechanically or electrically protect the network device 300 and/or socket 200. For example, the socket cover 400 may protect the socket 200 when a network device 300 is not provided. The socket cover 400 may be metal, fiberglass, plastic, or other material.

The socket cover 400 may include one or more tabs 464. The one or more tabs 464 may include one or more locking tabs 466, as shown in FIG. 1. The one or more tabs 464 may directly or indirectly engage the socket 200. For example, the one or more locking tabs 466 may engage with, for example, snap into, one or more recesses 214 in the socket 200. The network device 300 may include one or more openings 370 that allow the socket cover 400 to engage with the socket 200. As shown in FIG. 1, the one or more openings 370, one or more locking tabs 466, and one or more recesses 214 may be aligned, such that the socket cover 400 may engage with the socket 200. Once engaged with the socket 200, the socket cover 400 may cover the socket 200 and/or the network device 300.

In an alternative embodiment, the socket cover 400 may be integrated with or engage with the network device 300. For example, the one or more locking tabs 466 may engage with one or more recesses in the network device 300. In another example, the socket cover 400 may be formed as a component of the network device 300.

Figure 10A:
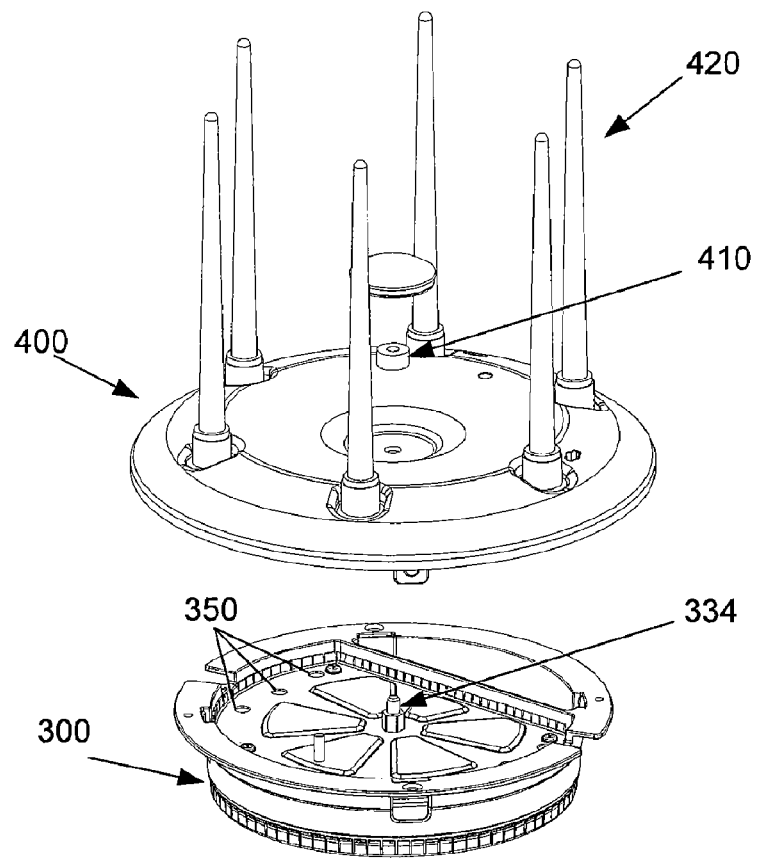
FIG. 10A and FIG. 10B illustrates embodiments of additional network modules.
Figure 10B:
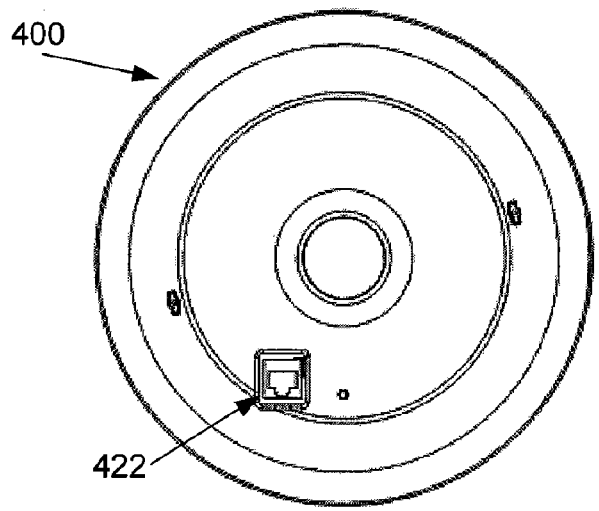

As shown in FIG. 10A, the socket cover 400 may include a cover connector 410 that is operable to mechanically couple the socket cover 400 to the network device 300. The cover connector 410 may include a nut, clamp, or other connector that connects to the securing connector 334 of the network device 300. As shown in FIG. 10B, the socket cover 400 may include an opening 422 that allows a connector, such as a connector 424, to extend through the socket cover 400.

Figure 11A:
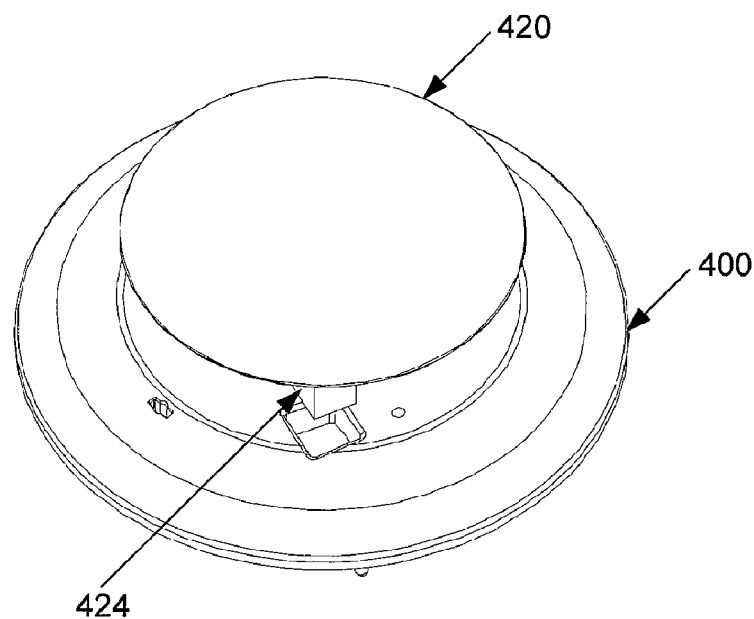
FIG. 11A and FIG. 11B illustrate embodiments of add-on devices.
Figure 11B:
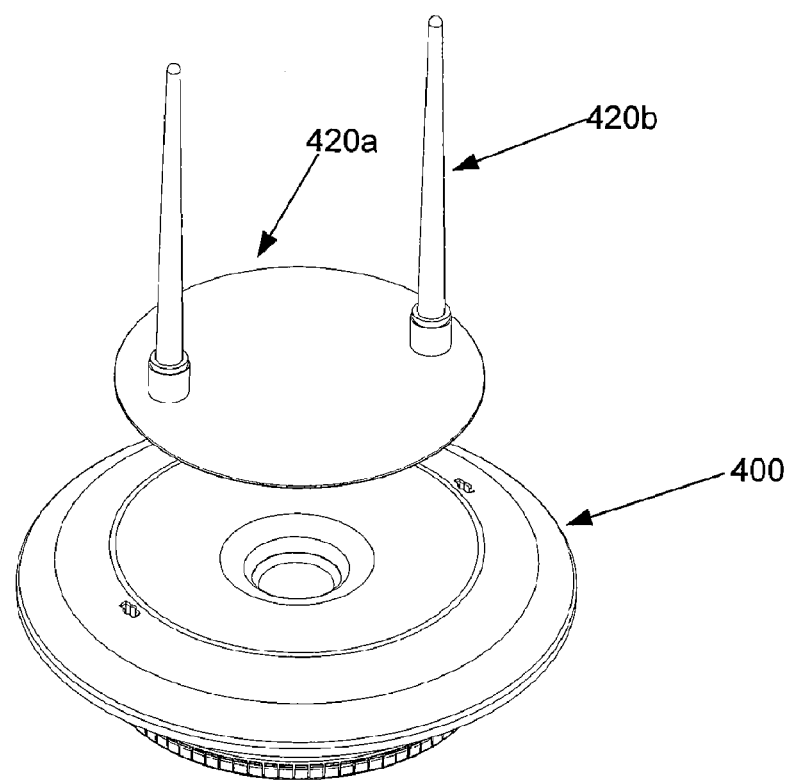

As shown in FIG. 11A, an add-on device 420 may include a connector 424 that extends through the opening 422 and connects to the additional network module 362. The socket cover 400 may be electrically coupled with the antenna circuit assembly 330 using the antenna connectors 350. For example, as shown in FIG. 11B, the antenna connectors 350 may electrically couple the antennas 352 with the antenna circuit assembly 320. The additional network module 362 may be provided in a separate module as a network circuit 322. The add-on device 420 may be operated by the additional network module 362. Alternatively, or additionally, the add-on device 420 may be operated by the network device circuit 322.

The socket cover 400 may include an add-on device 420 as shown in FIG. 11A. The add-on device 420 may be a cellular radio, a motion sensor, a light, a dipole antenna, any now known or later develop device that may be used with a wireless or wired network, or any combination thereof. For example, as shown in FIG. 11A, the add-on device 420 may be a cellular radio. In the example of FIG. 11B, the add-on device 420 may include a combination of a cellular radio 420*a* and one or more dipole antennas 420*b* used for amplifying a wireless signal. Alternatively, or additionally, the add-on device 420*a* of FIG. 11B may be a motion sensor for detecting motion and/or a light for providing light.

A method for connecting an add-on device to a socket cover is provided. The method includes supplying an additional network module into an add-on module of a network device, the add-on module being separate from a network module that supports a network device circuit; and connecting an add-on device to a socket cover, the add-on device being operated by and/or corresponding to the additional network module. Connecting the add-on device may include removing a pre-existing socket cover and replacing the pre-existing socket cover with a socket cover including the add-on device. Supplying the additional network module may include connecting the additional network module to the network device circuit.

The network system 100 may include a security system 600. The security system 600 may be a locking system or mechanism, anti-theft device, or other device for securing a network device 300.

Figure 12:
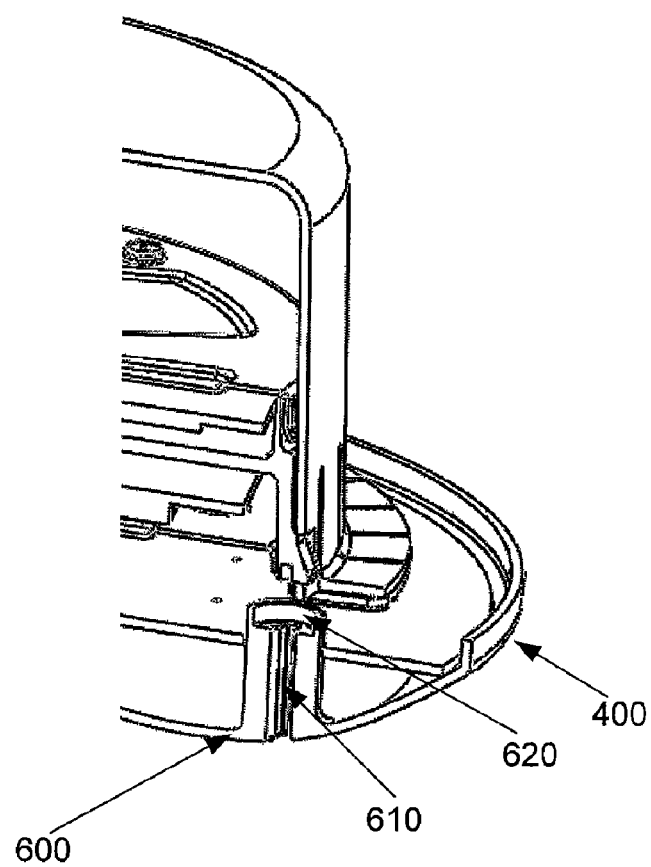
FIG. 12 illustrates one embodiment of a security system.
Figure 13:
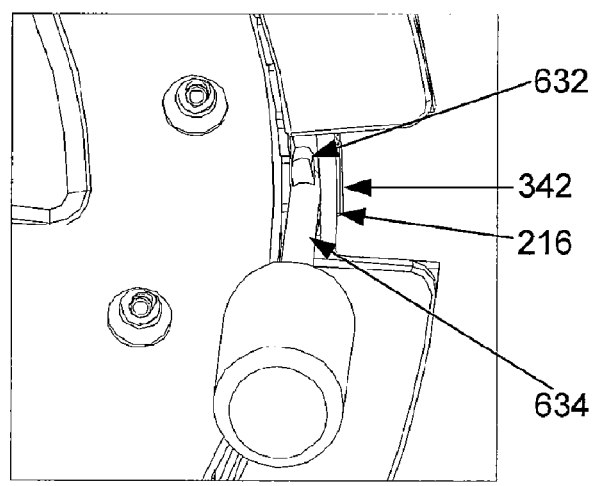
FIG. 13 illustrates one embodiment of a security tool in a security system.
Figure 14A:
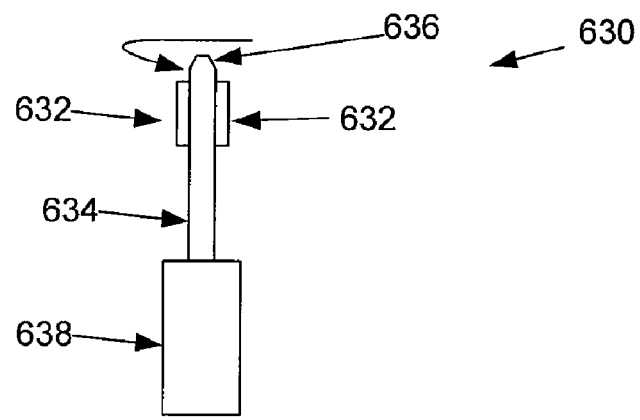
FIG. 14A, FIG. 14B, and FIG. 14C illustrate embodiments of the security tool.
Figure 14B:
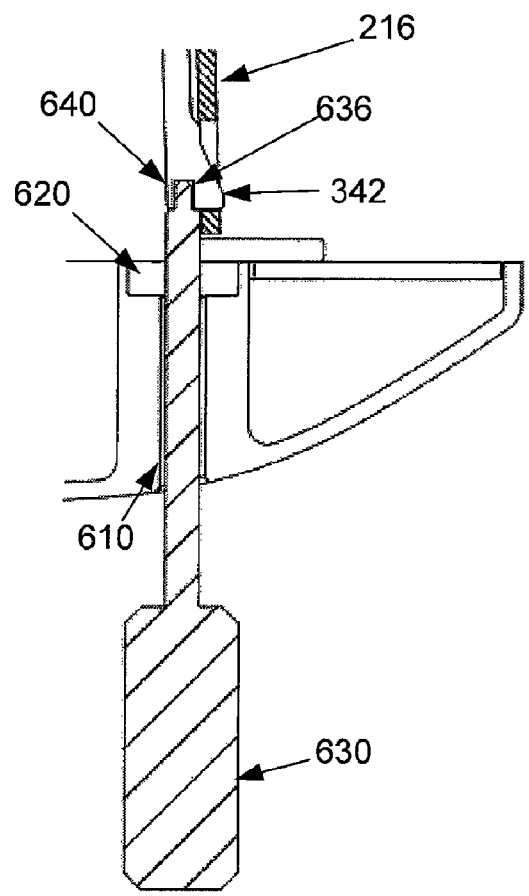

As shown in FIGS. 12 and 13, the security system 600 may include a security passage 610 and a rotational opening 620. The security passage 610 and the rotational opening 620 may be disposed in the socket cover 400. The security system 600 may include additional, different, or fewer components. For example, the security system 600 may include a security tool 630, as shown in FIG. 14A. The security tool 630 may include one or more rotational tabs 632, a shaft 634, an alignment pin 636, and a handle 638. The security tool 630 may include additional, different, or fewer components. As shown in FIG. 14B, the alignment pin 636 may be inserted into an alignment recess 640 in the locking tab 342. The security tool 630 may be positioned to release the locking tab 342 using the alignment pin 636.

Figure 14C:
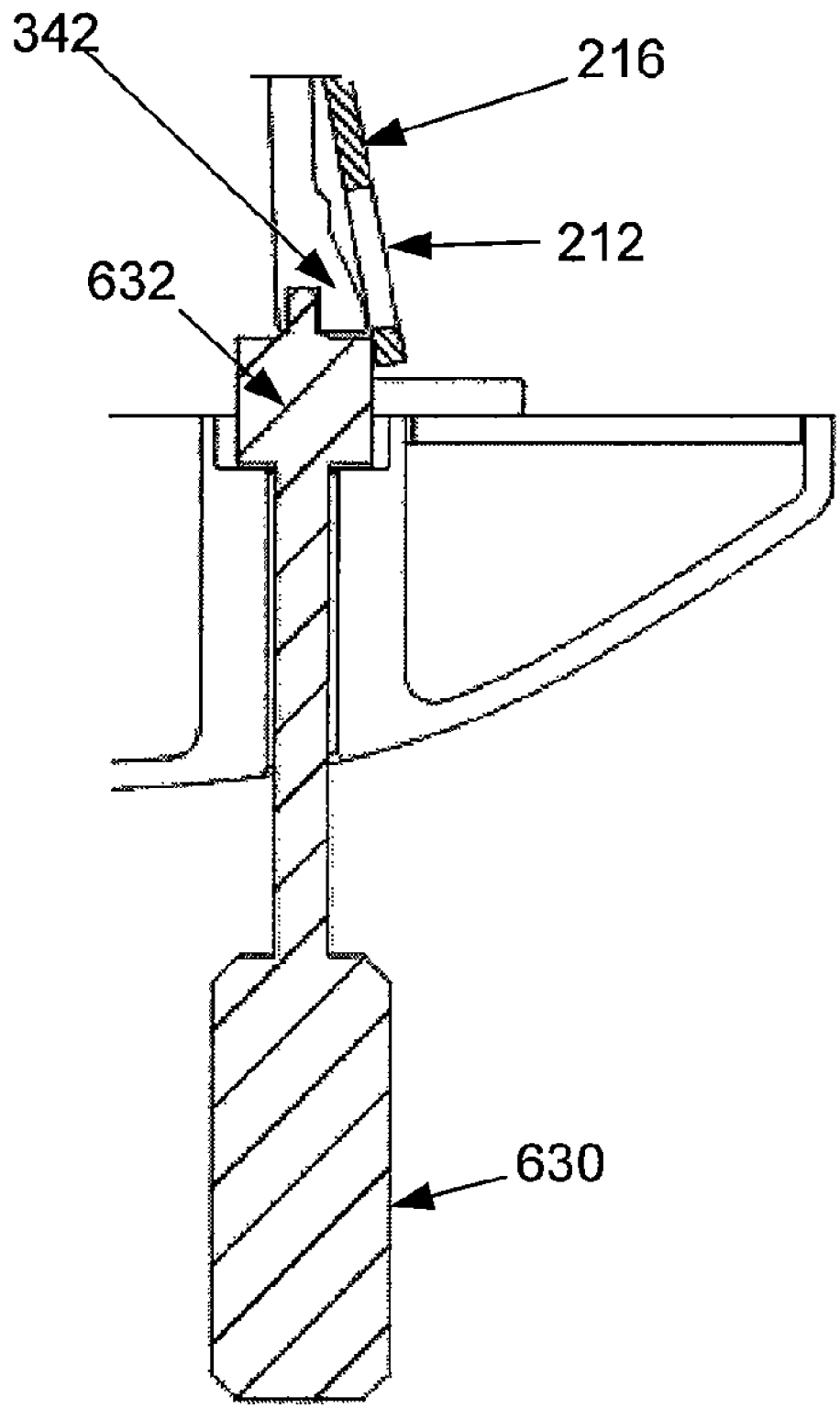

The one or more rotational tabs 632 may be sized to rotate in the rotational opening 620 and engage and move the socket finger 216 that includes a finger lock 212, which is operable to engage with a locking tab 342 of the network device. For example, as shown in FIG. 14B and FIG. 14C, the alignment pin 636 may be disposed in the alignment recess 640, such that when the rotational tab 342 engages the socket finger 216, the rotational tab 632 moves the socket finger 216 such that the locking tab 342 is released from the finger lock 212. The rotational tab 632 is sized such that when the rotational tab 632 is rotated in the rotational opening 620, the rotational tab 632 forces the socket 200 to move. The locking tab 342 is no longer engaging the locking recess 212. In one example, the rotational tab 632 may move a socket finger 216. The finger lock 212 may be disposed on the socket finger 216. Once the rotational tab 632 forces the socket finger 216 to move away from the locking tab 342, the locking tab 342 is no longer engaging the finger lock 212.

The security passage 610 may include a hole, opening, slot, via, or other passage. The security passage 610 may be the only passage to the locking tab 342. The locking tab 342 may be hidden, such that the locking tab 342 engages the finger lock 212 in an opening 107 of the installation surface 105. In this example, the installation surface 105 hides the locking tab 342. The security passage 610 may extend through the socket cover 400 and connect to the rotational opening 620. The security passage 610 may be sized and shaped such that the security tool 630 may be inserted into the security passage 610 of the socket cover 400 until the rotation tab 632 is disposed in the rotational opening. However, the security passage 610 is sized to prevent the security tool 630 from rotating in the security passage 610.

The rotational opening 620 may be disposed at one end of the security passage 610. The rotational opening 620 may be sized and positioned such that a rotational tab may be inserted into the security passage and rotated in the rotational opening to release a locking tab that is securing a network device.

One benefit of the security system 600 is that the locking feature may be hidden within the network system 100. The security system 600 also eliminates the need for having a post near the network device 300 for locking purposes.

Figure 15:
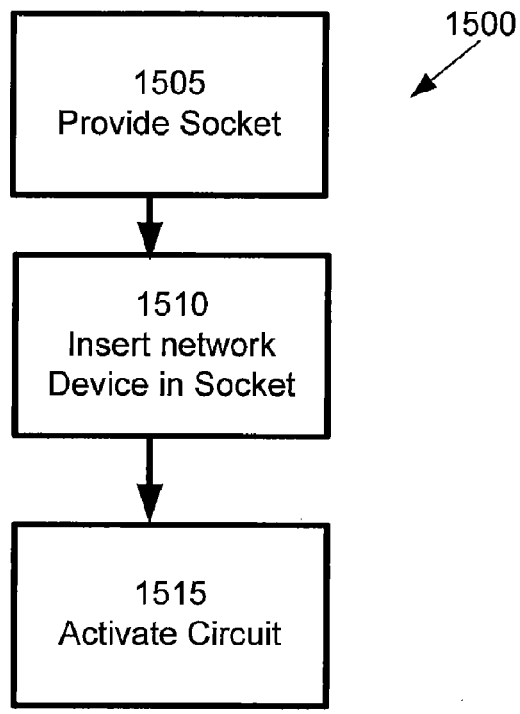
FIG. 15 illustrates one embodiment of a method for activating a network circuit.

FIG. 15 is a flow diagram describing one embodiment of a method 1500 for dissipating heat in a network system. The system 100 may be used to perform the acts of method 1500. The acts of the method 1500 may be performed in the order shown or a different order.

At block 1505, a socket made of heat conducting material with a top portion and bottom portion may be provided. For example, the socket may correspond to the socket 200 shown in FIG. 1. The socket may be made of a metal, such as aluminum. Non-metallic heat conducting materials may also be utilized. The thickness of the socket may be around 0.062 inches. The socket may also be thinner or thicker. The socket may include one or more fingers and/or flanges that are adapted to come into contact with a peripheral surface of a network device and/or in contact with complementary flanges on a network device. The fingers may exhibit a spring like force for pressing the fingers up against the network device.

At block 1510, a network device adapted to receive circuitry may be inserted into an interior of the socket. The network device may correspond to the network device 300 described above. The network device may be made of any heat conducting metal or non-metallic material. The circuitry within the network device may perform operations associated with a network access point. The circuitry may perform other functions as well.

At block 1515, circuitry within the network device may be activated. Once activated heat generated by the circuitry may be transferred to the socket and dissipated. In one embodiment, the socket is installed in a surface such as a ceiling tile and a portion of the socket is disposed within a cavity above the ceiling tile where heat may be dissipated. At least one advantage to this configuration is that it moves heat that would otherwise build up on the ceiling tile into the cavity where it may be dissipated more quickly. This in turns enables better heat dissipation for the network circuitry.

Figure 16:
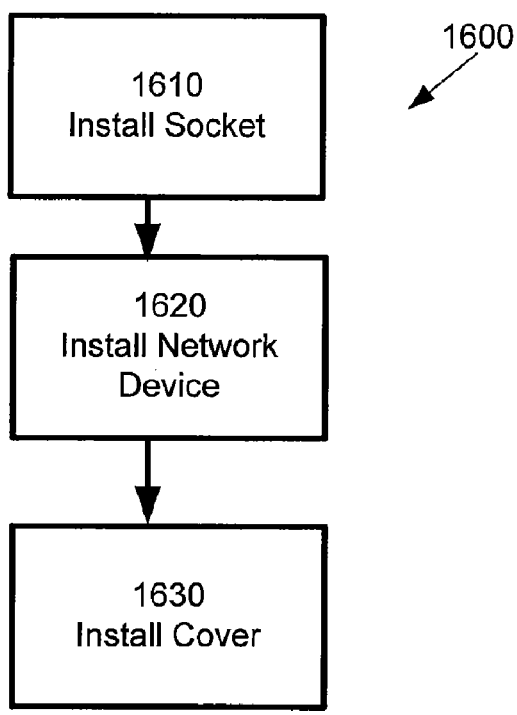
FIG. 16 illustrates one embodiment of a method for installing a network device.

FIG. 16 is a flow diagram describing one embodiment of a method 1600 for installing a network device. The system 100 may be used to perform the acts of method 1600. The acts of method 1600 may be performed in the order shown or a different order.

At block 1610, a socket may be installed with an opening of an installation surface. Installing the socket may include placing the socket into or through the opening or placing the socket above, below, or around the opening. When installed, the socket and the opening of the installation surface may define a continuous installation cavity. The socket may be attached with or fixed to the installation surface, for example, using a clamp ring.

At block 1620, the network device may be engaged with the socket. Engaging the network device with the socket may include bringing the socket and network device together and interlocking the socket and network device. For example, interlocking the socket may include threading the network device into the socket, snapping all or a portion of the network device into a recess of the socket, or snapping all or a portion of the socket into a recess of the network device. When engaged with the socket, all, some, or none of the network device may be disposed in the opening of the installation surface. For example, a first portion of the network device may be disposed on one side of the installation surface, a second portion of the network device may be disposed in the opening, and a third portion may be disposed on a second side of the installation surface.

At block 1630, a socket cover is engaged with a socket. Engaging the socket cover with the socket may include bringing the socket cover and the socket together and interlocking the socket and the socket cover. For example, interlocking the socket cover may include threading the socket cover into the socket, snapping all or a portion of the socket cover into a recess of the socket, or snapping all or a portion of the socket cover into a recess of the socket.

Figure 17:
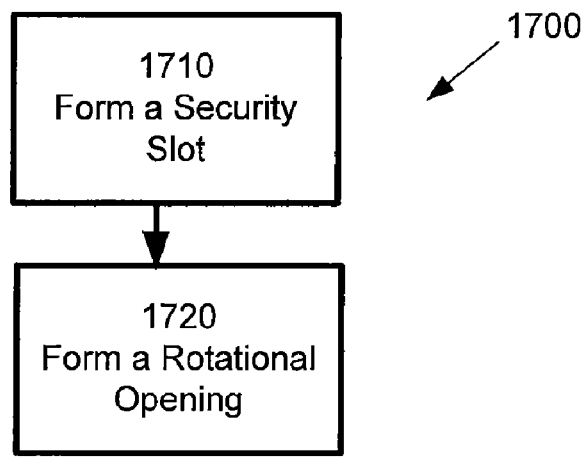
FIG. 17 illustrates one embodiment of a method for forming a security system.

FIG. 17 is a flow diagram describing a method 1700 for manufacturing a security system is provided. The method 1700 includes forming a security slot in a mounting system. At block 1710, a security slot is provided that is sized and shaped to receive a security tool. The security tool is operable to move a locking recess that engages and secures a locking tab of a network device. At block 1720, a rotational opening is formed at one end of the security slot. The rotational opening is shaped and sized to allow the security tool to rotate and move the locking recess away from the locking tab. Rotating the security tool may include rotating the security tool such that the security tool engages and moves the mounting system away from the locking tab. Forming the security slot may include forming an opening in a socket cover that is operable to engage a socket installed in an opening of an installation surface.

Forming the rotational opening may include forming an opening beneath the locking recess, such that the security tool may engage a socket finger, which includes the locking recess, and move the socket finger away from the locking tab. The method may also include forming the security tool using a mold that forms a shaft and rotational tab on one end of the shaft. Forming the security slot and the rotational opening may include using a mold to form the security slot and the rotational opening.

Figure 18:
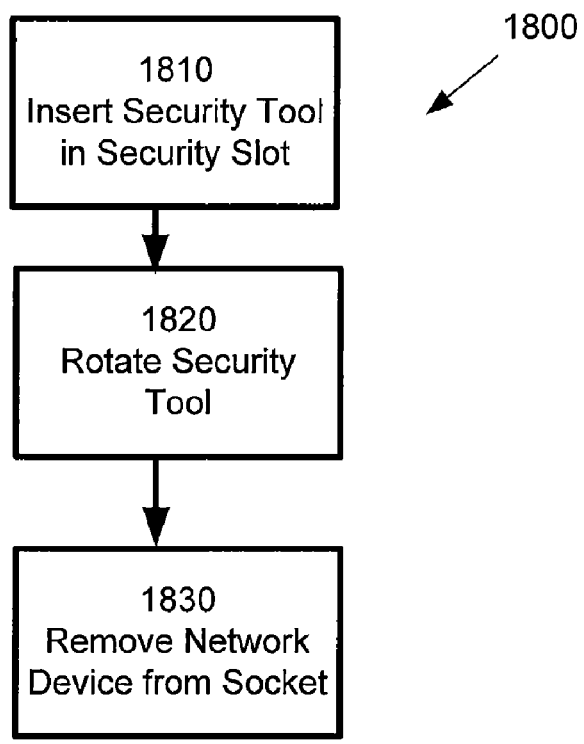
FIG. 18 illustrates one embodiment of a method for using a security tool.

FIG. 18 is a flow diagram describing one embodiment of a method 1800 for uninstalling a network device. The system 100 may be used to perform the acts of method 1800. The acts of method 1800 may be performed in the order shown or a different order.

At block 1810, a security tool is inserted into a security slot. The security tool is inserted into the security slot until a rotation tab on the security slot is disposed in a rotational opening of a security system. At block 1820, the security tool is rotated. The rotation tab is rotated in the rotational opening. The rotation of the security tool may move a finger of a socket away from a network device. For example, the rotation of the security tool may rotate a finger lock of the socket away from a locking tab of the network device. The locking tab may no longer be disposed in the finger lock. At block 1830, the network device may be removed from the socket since the locking tab is no engaged with the finger lock.

While the invention has been described above by reference to various embodiments, it should be understood that many changes and modifications can be made without departing from the scope of the invention. For example, sizes, shapes, numbers of parts, arrangements, orders, or connections may be used. It is therefore intended that the foregoing detailed description be regarded as illustrative rather than limiting, and that it be understood that it is the following claims, including all equivalents, that are intended to define the spirit and scope of this invention.

The invention claimed is:

1. A network system comprising: a socket with a top portion and a bottom portion, wherein the socket is made of heat conducting material; and a network device adapted to receive circuitry and be inserted into an interior of the socket, wherein when the network device is inserted into the socket, the socket dissipates heat generated by the circuitry; a plurality of fingers in the bottom portion of the socket that springedly come into contact with a peripheral surface of the network device in a first plane, wherein heat is transferred to the socket via the plurality of fingers; and at least one socket flange extending from the plurality of fingers, wherein the at least one socket flange contacts the peripheral surface of the network device in a second plane, the second plane is not parallel to the first plane, wherein heat is transferred to the socket via the at least one socket flange.

2. The network device according to claim 1, wherein the socket is made of aluminum.

3. The network device according to claim 1, wherein a thickness of the socket is 0.02 to 0.1 inches.

4. The network device according to claim 1, wherein the network device is made of aluminum.

5. The network device according to claim 1, wherein the network device includes at least one network device flange complementary to the at least one socket flange, such that when the network device is inserted into the socket, an upper surface of the at least one network device flange comes in contact with a lower surface of the at least one socket flange.

6. The network device according to claim 1, wherein the network device is a wireless access point.

7. The network device according to claim 1, further comprising:
an antenna coupled to the network device; and
a cover enclosing the antenna, wherein the cover engages the socket.

8. A method for dissipating heat in a network system, the method comprising: providing a socket made of heat conducting material; inserting a network device adapted to receive circuitry into an interior of the socket; and transferring heat from the network device to the socket via a plurality of fingers and at least one socket flange, wherein the plurality of fingers springedly come into contact with a peripheral surface of the network device in a first plane, and the at least one socket flange contacts the peripheral surface of the network device in a second plane, the second plane is different than the first plane.

9. The method according to claim 8, wherein the socket is made of aluminum.

10. The method according to claim 8, wherein a thickness of the socket is greater than 0.03 inches.

11. The method according to claim 8, wherein the network device is made of aluminum.

12. The method according to claim 8, wherein the network device includes at least one network device flange, such that when the network device is inserted into the socket, an upper surface of the at least one network device flange comes in contact with a lower surface of the at least one socket flange.

13. The method according to claim 8, wherein the network device includes a circuit that is operable to perform functions associated with a network access point.

14. The method according to claim 8, further comprising: attaching a cover that encloses an antenna of the network device and engages a recess in one of the plurality of fingers.

15. A socket for mounting a network communication device, the socket comprising: a top portion; and a bottom portion including a plurality of fingers in the bottom portion of the socket that springedly come into contact with a peripheral surface of the network communication device in a first plane, wherein heat is transferred to the socket via the plurality of fingers; and at least one socket flange extending from the plurality of fingers, wherein the at least one socket flange contacts the peripheral surface of the network communication device in a second plane, the second plane is different than the first plane, wherein heat is transferred to the socket via the at least one socket flange, wherein the top portion and the bottom portion are sized to engage with the network communication device inserted into an interior of the socket from a first side of an installation surface, the top portion and the bottom portion being operable to draw heat away from the network communication device and release the heat on a second side of the installation surface.

16. The socket according to claim 15, wherein the top portion and the bottom portion are made of metal.

17. The socket according to claim 15, wherein the network communication device includes a network device flange that engages with the at least one socket flange, the at least one socket flange being operable to transfer heat from the network device flange to the top portion that is disposed on a side of the installation surface that is opposite the network device flange.

18. The socket according to claim 15, wherein the socket is sized to press fit the network device.

19. The socket according to claim 15, further comprising: a recess configured to engage a locking tab of a cover enclosing an antenna of the network communication device.

* * * * *